(12) United States Patent
Jin et al.

(10) Patent No.: US 11,347,611 B2
(45) Date of Patent: May 31, 2022

(54) FAULT DIAGNOSIS SYSTEM AND SERVER

(71) Applicant: HUAWEI TECHNOLOGIES CO., LTD., Guangdong (CN)

(72) Inventors: Ke Jin, Hangzhou (CN); Dongshu Zhou, Hangzhou (CN)

(73) Assignee: XFUSION DIGITAL TECHNOLOGIES CO., LTD., Zhengzhou (CN)

( * ) Notice: Subject to any disclaimer, the term of this patent is extended or adjusted under 35 U.S.C. 154(b) by 0 days.

(21) Appl. No.: 17/193,048

(22) Filed: Mar. 5, 2021

(65) Prior Publication Data

US 2021/0191831 A1 Jun. 24, 2021

Related U.S. Application Data

(63) Continuation of application No. PCT/CN2019/090352, filed on Jun. 6, 2019.

(30) Foreign Application Priority Data

Sep. 6, 2018 (CN) .......................... 201811039579.7

(51) Int. Cl.
*G06F 11/26* (2006.01)
*G06F 11/22* (2006.01)
(Continued)

(52) U.S. Cl.
CPC .......... *G06F 11/26* (2013.01); *G06F 11/2242* (2013.01); *G06F 13/4022* (2013.01); *H03K 17/005* (2013.01)

(58) Field of Classification Search
CPC .. G06F 11/07; G06F 11/0703; G06F 11/0754; G06F 11/22; G06F 11/2205;
(Continued)

(56) References Cited

U.S. PATENT DOCUMENTS 6,373,376 B1 * 4/2002 Adams ................. G05B 19/042
340/538.13
6,448,901 B1 * 9/2002 Adams ................... H04L 12/40
340/2.1
(Continued)

FOREIGN PATENT DOCUMENTS

CN 101894056 A 11/2010
CN 101894060 A 11/2010
(Continued)

OTHER PUBLICATIONS

Extended European Search Report issued in EP 19857042.6, dated Sep. 14, 2021, 12 pages.
(Continued)

*Primary Examiner* — Jason Crawford (57) ABSTRACT

A fault diagnosis system is disclosed, including: a control unit, a first management board, a first pull-up unit, a second pull-up unit, a first pull-up switch, a second pull-up switch, and at least one central processing unit, the control unit is configured to receive physical partitioning information sent by the first management board, the first pull-up unit and the second pull-up unit are configured to pull up a fault indication signal of a fault diagnosis path to obtain a target signal, the first management board is configured to detect whether a level of the target signal is lower than a diagnosis threshold, and when the level of the target signal is lower than the diagnosis threshold, determine that a faulty central processing unit exists in the at least one central processing unit.

14 Claims, 9 Drawing Sheets

(51) Int. Cl.
  *G06F 13/40* (2006.01)
  *H03K 17/00* (2006.01)

(58) Field of Classification Search
  CPC .. G06F 11/2236; G06F 11/2242; G06F 11/26;
  G06F 11/261
  See application file for complete search history.

(56) References Cited

U.S. PATENT DOCUMENTS

| | | | |
|---|---|---|---|
| 7,511,507 B2* | 3/2009 | Hatagami | G01R 31/2884 |
| | | | 324/522 |
| 2007/0001705 A1* | 1/2007 | Yokota | G01R 31/71 |
| | | | 324/750.3 |
| 2013/0061098 A1 | 3/2013 | Shigehara | |
| 2015/0309522 A1* | 10/2015 | Fang | G05B 15/02 |
| | | | 700/22 |
| 2018/0136999 A1* | 5/2018 | Fernandez | G01R 31/44 |
| 2021/0191831 A1* | 6/2021 | Jin | G06F 11/0754 |

FOREIGN PATENT DOCUMENTS

| | | |
|---|---|---|
| CN | 106446311 A | 2/2017 |
| CN | 107450414 A | 12/2017 |
| CN | 107844392 A | 3/2018 |
| CN | 109101009 A | 12/2018 |
| EP | 2464041 A1 | 6/2012 |
| WO | 2018076351 A1 | 5/2018 |

OTHER PUBLICATIONS

International Search Report and Written Opinion issued in PCT/CN2019/090352 dated Sep. 3, 2019, 12 pages.

* cited by examiner

FAULT DIAGNOSIS SYSTEM AND SERVER

CROSS-REFERENCE TO RELATED APPLICATIONS

This application is a continuation of International Application No. PCT/CN2019/090352 filed on Jun. 6, 2019, which claims priority to Chinese Patent Application No. 201811039579.7, filed on Sep. 6, 2018. The disclosures of the aforementioned applications are hereby incorporated by reference in their entireties.

TECHNICAL FIELD

Embodiments of this application relate to the field of circuit technologies, and in particular, to a fault diagnosis system and a server.

BACKGROUND

As the requirements for server performance are increasingly high, a server with a single central processing unit (CPU) cannot meet the high-performance computing requirement. Servers have been evolved to 2-socket, 4-socket, or 8-socket high-performance servers, and need to have physical partitioning capability. As servers continuously evolve, the requirement for service processing capability of a server management board is increasingly high, and a CPU fault indication signal circuit topology is increasingly complex.

In the prior art, a CPU fault indication signal of each node board in the CPU fault indication signal circuit topology is separately transmitted to a server management board by using a backplane. CPU fault indication signals of every two CPUs on the server management board are converged, and the converged CPU fault indication signal after level shift is uploaded to a complex programmable logic device. The complex programmable logic device performs convergence in the complex programmable logic device (CPLD) based on a current physical partitioning state to obtain the CPU fault indication signal.

However, because the CPU fault indication signal of each node board is separately transmitted to the server management board by using the backplane, all isolation circuits and level shift circuits need to be placed on the server management board. This increases circuit complexity of the server management board and cabling difficulty of the CPU fault indication signal circuit topology.

SUMMARY

Embodiments of this application provide a fault diagnosis system, to detect fault indication signals of a plurality of CPUs of a server by using the fault diagnosis system, and reduce circuit cabling complexity of the fault diagnosis system.

A first aspect of an embodiment of this application provides a fault diagnosis system. The fault diagnosis system may be applied to a server. The fault diagnosis system includes a control unit, a first management board, a first pull-up unit, a second pull-up unit, a first pull-up switch, a second pull-up switch, and at least one central processing unit. The first pull-up unit is electrically connected to the first pull-up switch, the second pull-up unit is electrically connected to the second pull-up switch, the control unit is electrically connected to the first management board, and the control unit is electrically connected to the first pull-up switch and the second pull-up switch separately. The control unit is configured to receive physical partitioning information sent by the first management board, and control, based on the physical partitioning information, the first pull-up switch and the second pull-up switch to be turned on separately, so that each central processing unit is electrically connected to the first pull-up switch and the second pull-up switch separately to form a fault diagnosis path, and the fault diagnosis path includes a path from the first pull-up unit to the first pull-up switch, from the first pull-up switch to the at least one central processing unit, from the at least one central processing unit to the second pull-up switch, and from the second pull-up switch to the second pull-up unit. The first pull-up unit and the second pull-up unit are configured to pull up a fault indication signal of the fault diagnosis path to obtain a pulled-up target signal. The first management board is configured to detect whether a level of the target signal is lower than a diagnosis threshold, and when the level of the target signal is lower than the diagnosis threshold, determine that a faulty central processing unit exists in the at least one central processing unit on the fault diagnosis path. The control unit, the first pull-up unit, the second pull-up unit, the first pull-up switch, the second pull-up switch, and the at least one central processing unit are located at a first node board.

Based on the first aspect of the embodiment of this application, in a first implementation of the first aspect of the embodiment of this application, the fault diagnosis system further includes a first analog switch and a second analog switch. The control unit includes a first control module and a second control module, the first control module is electrically connected to the first pull-up switch and the first analog switch separately, and the second control module is electrically connected to the second pull-up switch and the second analog switch separately. The first control module is configured to receive the physical partitioning information sent by the first management board, and control, based on the physical partitioning information, the first pull-up switch and the first analog switch to be separately turned on. The second control module is configured to receive the physical partitioning information sent by the first management board, and control, based on the physical partitioning information, the second pull-up switch and the second analog switch to be separately turned on, so that each central processing unit is further electrically connected to the first analog switch and the second analog switch separately to form the fault diagnosis path, and the fault diagnosis path further includes the first analog switch and the second analog switch between the first pull-up switch and the second pull-up switch.

Based on the first aspect of the embodiment of this application and the first implementation of the first aspect, in a second implementation of the first aspect of the embodiment of this application, the fault diagnosis system further includes a third analog switch and a fourth analog switch. The control unit further includes a third control module and a fourth control module, the third control module is electrically connected to the third analog switch, and the fourth control module is electrically connected to the fourth analog switch. The third control module is configured to receive the physical partitioning information sent by the first management board, and control, based on the physical partitioning information, the third analog switch to be turned on, the fourth control module is configured to receive the physical partitioning information sent by the first management board, and control, based on the physical partitioning information, the fourth analog switch to be turned on, so that each central processing unit is further electrically connected to the third analog switch and the fourth analog switch separately to form the fault diagnosis path, and the fault diagnosis path further includes the third analog switch and the fourth analog switch between the first analog switch and the second analog switch.

Based on any one of the first aspect of the embodiment of this application, the first implementation of the first aspect, or the second implementation of the first aspect, in a third implementation of the first aspect of the embodiment of this application, the fault diagnosis system further includes a third pull-up unit, a third pull-up switch, a fourth pull-up unit, and a fourth pull-up switch, the third pull-up switch is electrically connected to the first management board, the third pull-up unit is electrically connected to the third pull-up switch, the fourth pull-up switch is electrically connected to the first management board, and the fourth pull-up unit is electrically connected to the fourth pull-up switch.

Based on any one of the first aspect of the embodiment of this application or the first implementation of the first aspect to the third implementation of the first aspect, in a fourth implementation of the first aspect of the embodiment of this application, the fault diagnosis system further includes a fifth pull-up unit, a fifth pull-up switch, a sixth pull-up unit, a sixth pull-up switch, a seventh pull-up unit, a seventh pull-up switch, an eighth pull-up unit, and an eighth pull-up switch, the fifth pull-up switch is electrically connected to the first management board, the fifth pull-up unit is electrically connected to the fifth pull-up switch, the sixth pull-up switch is electrically connected to the first management board, the sixth pull-up unit is electrically connected to the sixth pull-up switch, the seventh pull-up switch is electrically connected to the first management board, the seventh pull-up unit is electrically connected to the seventh pull-up switch, the eighth pull-up switch is electrically connected to the first management board, and the eighth pull-up unit is electrically connected to the eighth pull-up switch.

Based on any one of the first aspect of the embodiment of this application or the first implementation of the first aspect to the fourth implementation of the first aspect, in a fifth implementation of the first aspect of the embodiment of this application, the fault diagnosis system further includes a central backplane, and the central backplane is configured to connect node boards respectively corresponding to the first control module, the second control module, the third control module, and the fourth control module.

Based on any one of the first aspect of the embodiment of this application or the first implementation of the first aspect to the fifth implementation of the first aspect, in a sixth implementation of the first aspect of the embodiment of this application, the first management board is further configured to send presence information to the first control module, the second control module, the third control module, and/or the fourth control module, and the presence information is used to indicate states of the node boards respectively corresponding to the first control module, the second control module, the third control module and/or the fourth control module.

Based on any one of the first aspect of the embodiment of this application or the first implementation of the first aspect to the sixth implementation of the first aspect, in a seventh implementation of the first aspect of the embodiment of this application, the fault diagnosis system further includes a level shift unit, and the level shift unit is electrically connected to the first management board.

Based on any one of the first aspect of the embodiment of this application or the first implementation of the first aspect to the seventh implementation of the first aspect, in an eighth implementation of the first aspect of the embodiment of this application, the fault diagnosis system further includes a second management board, and the second management board is electrically connected to the first control module, the second control module, the third control module, and the fourth control module separately.

Based on any one of the first aspect of the embodiment of this application or the first implementation of the first aspect to the eighth implementation of the first aspect, in a ninth implementation of the first aspect of the embodiment of this application, the physical partitioning information includes 2P mode information, 4P mode information, or 8P mode information, the 2P mode information corresponds to two processors in the at least one processor, the 4P mode information corresponds to four processors in the at least one processor, and the 8P mode information corresponds to eight processors in the at least one processor.

Based on any one of the first aspect of the embodiment of this application or the first implementation of the first aspect to the ninth implementation of the first aspect, in a tenth implementation of the first aspect of the embodiment of this application, the first management board includes a first CPLD.

Based on any one of the first aspect of the embodiment of this application or the first implementation of the first aspect to the tenth implementation of the first aspect, in an eleventh implementation of the first aspect of the embodiment of this application, the control unit includes a second CPLD.

A second aspect of an embodiment of this application provides a server. The server includes the fault diagnosis system according to any one of the first aspect, and the first implementation of the first aspect to the eleventh implementation of the first aspect.

According to the foregoing technical solutions, it can be learned that the embodiments of this application have the following advantages.

In the embodiments of this application, the control unit and the switch are all located on the node board. The control unit may control, based on the current physical partitioning information, the presence information, and slot number information of the node board, the switch to change a fault indication signal topology, to adapt to current physical partitioning setting and a system requirement. Fault synchronization between the node boards can be implemented by using the central backplane, which does not require participation of the management board. In addition, the circuit is decoupled from the management board, and a circuit and a function of the management board are simplified. Therefore, the fault diagnosis system provided in the embodiments of this application reduces cabling of the server management board, to reduce cabling complexity between the node board and the server management board.

DESCRIPTION OF EMBODIMENTS

The following clearly describes the technical solutions in embodiments of this application with reference to accompanying drawings in the embodiments of this application. Apparently, the described embodiments are some but not all of the embodiments of this application. All other embodiments obtained by persons of ordinary skill in the art based on the embodiments of this application without creative efforts shall fall within the protection scope of the embodiments of this application.

In the specification, claims, and the accompanying drawings of embodiments of this application, the terms "first", "second", "third", "fourth", and so on (if existent) are intended to distinguish between similar objects, but do not necessarily indicate a specific order or sequence. It should be understood that data termed in such a way is interchangeable in appropriate cases, so that embodiments of this application described herein can be implemented, for example, in other orders than the order illustrated or described herein. In addition, the terms "include", "contain" and any other variants mean to cover non-exclusive inclusion, for example, a process, method, system, product, or device that includes a list of steps or units is not necessarily limited to those steps or units that are expressly listed, instead, other steps or units that are not expressly listed or inherent to such processes, methods, products, or devices may be included.

Embodiments of this application provide a fault diagnosis system, to detect fault indication signals of a plurality of CPUs of a server by using the fault diagnosis system, and reduce circuit cabling complexity of the fault diagnosis system.

Figure 1:
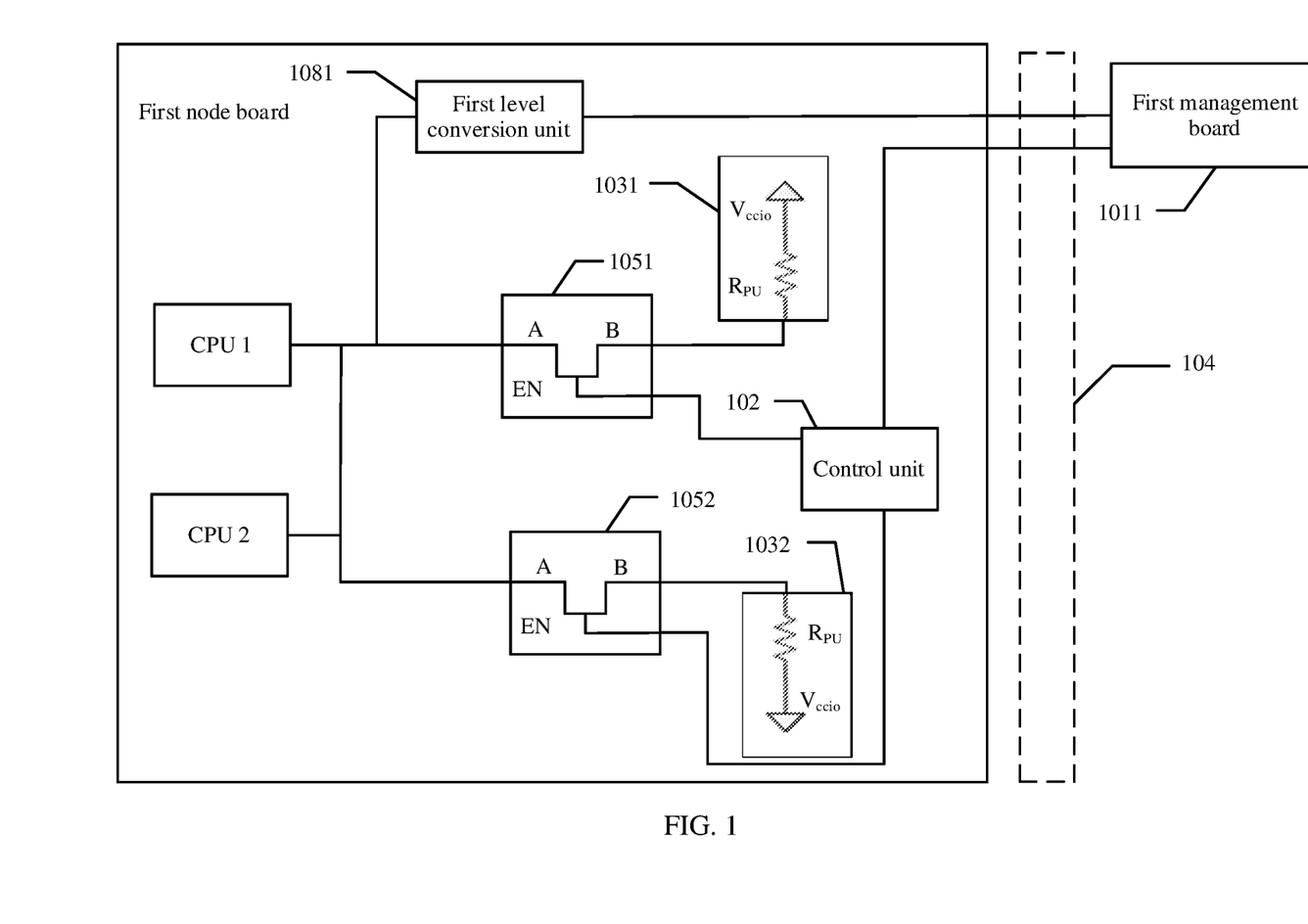
FIG. 1 is a schematic diagram of a fault diagnosis system according to an embodiment of this application.

The following describes the fault diagnosis system provided in the embodiments of this application. FIG. 1 is a schematic diagram of a fault diagnosis system according to an embodiment of this application. The fault diagnosis system provided in the embodiments of this application includes:

a first management board 1011, a control unit 102, a first pull-up unit 1031, a second pull-up unit 1032, a first pull-up switch 1051, a second pull-up switch 1052, a central backplane 104, a first level shift unit 1081, and at least one central processing unit (CPU), where the first management board 1011 is specifically a server management board, the control unit 102, the first pull-up unit 1031, the second pull-up unit 1032, the first pull-up switch 1051, the second pull-up switch 1052, the first level shift unit 1081 and the at least one central processing unit (CPU) are located on a first node board of the server, and it should be noted that the at least one CPU in this embodiment is described by using a CPU 1 and a CPU 2 as an example.

A connection relationship between units in the fault diagnosis system provided in this embodiment may be shown as follows:

The first pull-up unit 1031 is electrically connected to the first pull-up switch 1051. The second pull-up unit 1032 is electrically connected to the second pull-up switch 1052. The control unit 102 is electrically connected to the first pull-up switch 1051 and the second pull-up switch 1052 separately. The control unit 102 is electrically connected to the first management board 1011. The first level shift unit 1081 is electrically connected to the first management board 1011. The central backplane 104 is separately connected to the first management board 1011 and the first node board.

The control unit 102 is configured to receive physical partitioning information and presence information sent by the first management board 1011. The presence information is presence information of another node board and is used to indicate a presence state of the another node board. The control unit 102 sends a control signal to the first pull-up switch 1051 and the second pull-up switch 1052 based on the physical partitioning information and slot number information of the first node board, so that the first pull-up switch 1051 and the second pull-up switch 1052 are turned on respectively, the CPU 1 and the CPU 2 are electrically connected to the first pull-up switch 1051 respectively, and the CPU 1 and the CPU 2 are electrically connected to the second pull-up switch 1052 respectively to form a fault diagnosis path. The fault diagnosis path includes a path from the first pull-up unit 1031 to the first pull-up switch 1051, from the first pull-up switch 1051 to the CPU 1, from the CPU 1 to the CPU 2, from the CPU 2 to the second pull-up switch 1052, and from the second pull-up switch 1052 to the second pull-up unit 1032. It should be noted that the slot number information is used to indicate a relative position of the node board currently inserted into the central backplane.

It should be noted that, in this embodiment and subsequent embodiments, the first level shift unit 1081 may be electrically connected to the first management board 1011 by using general-purpose input/output (GPIO). The control unit 102 is electrically connected to the first management board 1011. There is no restriction on a communications protocol.

The first pull-up unit 1031 and the second pull-up unit 1032 are configured to pull up a level of a fault indication signal of the fault diagnosis path to obtain a pulled-up target signal. A level of the target signal is higher than a diagnosis threshold.

After the first pull-up unit 1031 and the second pull-up unit 1032 pull up the fault indication signal to obtain the target signal, the target signal is transmitted to the first level shift unit 1081. The first level shift unit 1081 sends the target signal to the first management board 1011. The first management board 1011 is configured to detect whether the level of the target signal is lower than the diagnosis threshold. When the level of the target signal is lower than the diagnosis threshold, the first management board 1011 determines that a faulty CPU exists in the at least one CPU on the fault diagnosis path. In other words, the first management board 1011 determines at least one CPU of the CPU 1 and the CPU 2 is faulty. After determining that the at least one CPU of a complex programmable logic device (CPLD) of the first management board 1011 is faulty, a baseboard management controller (BMC), or another management chip in the server is notified to collect fault information of the central processing unit.

It should be noted that, in this embodiment, the first management board 1011 may be a server management board. The first management board 1011 may send the physical partitioning information to the control unit 102 by using a first CPLD. The control unit 102 provided in this embodiment may be a second CPLD on the node board.

In this embodiment, after any CPU is faulty in the fault diagnosis system, another CPU may sense that the level of the target signal is lower than the diagnosis threshold, and determine that fault occurs. For example, after the CPU 1 is faulty, the CPU 2 determines that the level of the target signal is lower than the diagnosis threshold, and determines that the fault occurs. The CPU 2 terminates a current service and synchronizes a fault state. It can be understood that fault synchronization between node boards can be implemented by using the central backplane, which does not require participation of the management board. In addition, the circuit is decoupled from the management board, and a circuit and a function of the management board are simplified. Therefore, the fault diagnosis system provided in this application reduces cabling of the server management board, to reduce cabling complexity between the node board and the server management board.

The foregoing describes the fault diagnosis system provided in the embodiments of this application. The following describes another fault diagnosis system provided in the embodiments of this application.

Figure 2:
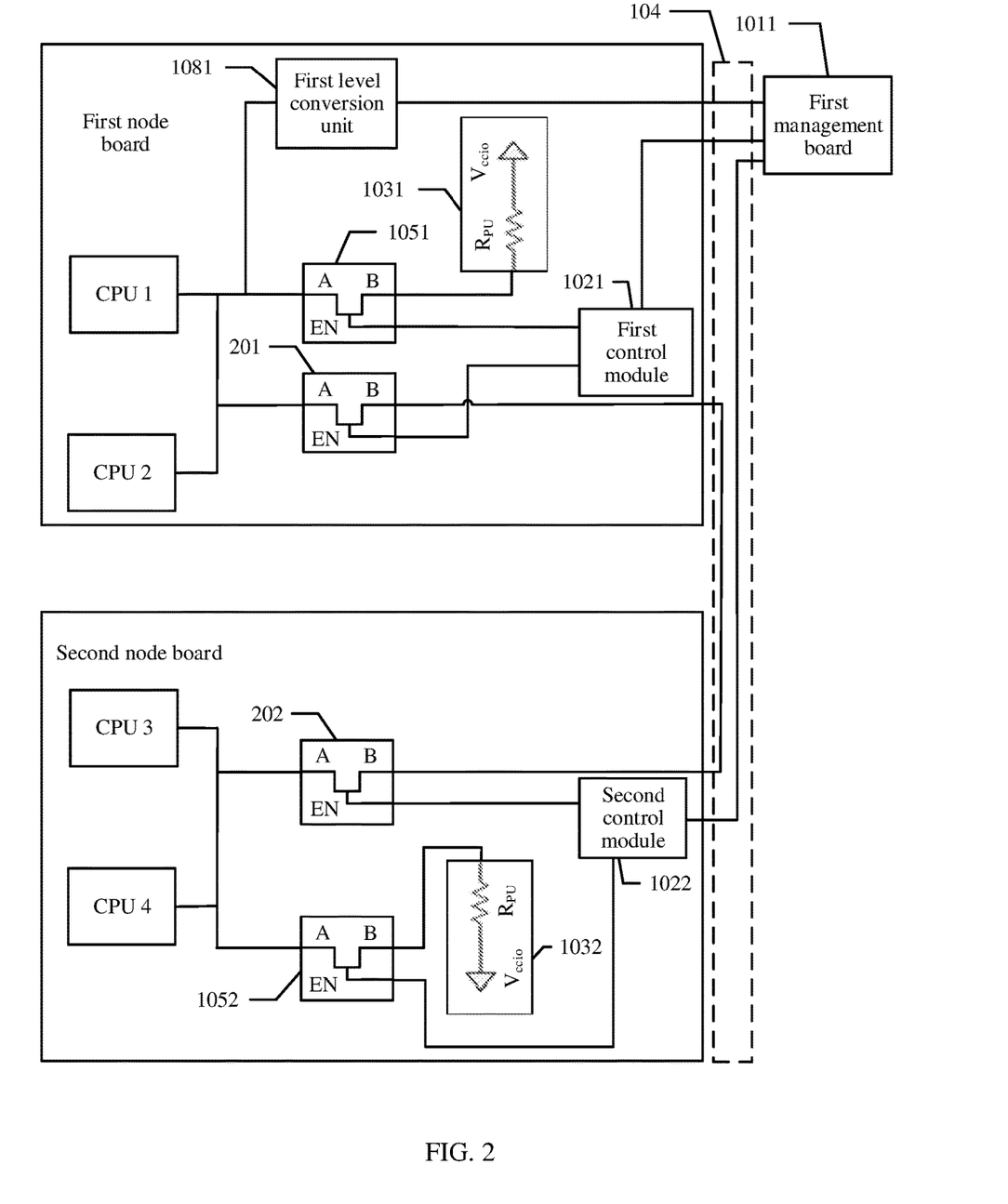
FIG. 2 is another schematic diagram of a fault diagnosis system according to an embodiment of this application.

FIG. 2 is another schematic diagram of a fault diagnosis system according to an embodiment of this application. Another embodiment of the fault diagnosis system provided in the embodiments of this application includes:

The fault diagnosis system may further include a first analog switch 201 and a second analog switch 202. The control unit 102 may include a first control module 1021 and a second control module 1022. The first analog switch 201 and the first control module 1021 are separately located on the first node board, the second analog switch 202 and the second control module 1022 are separately located on a second node board. It should be noted that, in this embodiment, the first pull-up unit 1031 and the first pull-up switch 1051 are located on the first node board, and the second pull-up unit 1032 and the second pull-up switch 1052 are located on the second node board.

It should be noted that the control module in this embodiment and subsequent embodiments includes the second CPLD on the node board. For example, the first control module 1021 is a CPLD on the first node board, and the second control module may be a CPLD on the second node board.

The at least one CPU in this embodiment is described by using a CPU 1, a CPU 2, a CPU 3, and a CPU 4 as an example. The CPU 1 and the CPU 2 may be located on the first node board, and the CPU 3 and the CPU 4 may be located on the second node board.

A connection relationship between units in the fault diagnosis system provided in this embodiment may be shown as follows:

The first control module 1021 is electrically connected to the first pull-up switch 1051. The first control module 1021 may further be electrically connected to the first analog switch 201. The second control module 1022 is electrically connected to the second pull-up switch 1052. The second control module 1022 may further be electrically connected to the second analog switch 202. The first analog switch 201 is electrically connected to the second analog switch 202. The central backplane 104 is separately connected to the first management board 1011, the first node board, and the second node board.

The first control module 1021 and the second control module 1022 in this embodiment are respectively configured to receive the second physical partitioning information and the presence information that are sent by the first management board 1011. The presence information is the presence information of the another node board and is used to indicate the presence state of the another node board. The first control module 1021 receives presence information of the second node board, and the second control module 1022 receives presence information of the first node board.

The first control module 1021 sends the control signal to the first pull-up switch 1051 based on the physical partitioning information and slot number information of the first node board. After the first pull-up switch 1051 receives the control signal, the first pull-up switch 1051 is turned on, to enable the first pull-up unit 1031. After the first control module 1021 receives the physical partitioning information, the first control module 1021 may further send the control signal to the first analog switch 201, so that the first analog switch 201 is turned on.

The second control module 1022 sends the control signal to the second pull-up switch 1052 based on the physical partitioning information and slot number information of the second node board. After the second pull-up switch 1052 receives the control signal, the second pull-up switch 1052 is turned on, to enable the second pull-up unit 1032. After the second control module 1022 receives the second control signal, the second control module 1022 may further send the control signal to the second analog switch 202, so that the second analog switch 202 is turned on.

After the first analog switch 201, the second analog switch 202, the first pull-up switch 1051, and the second pull-up switch 1052 in the fault diagnosis system are turned on separately, the first pull-up unit 1031 and the second pull-up unit 1032 are configured to pull up the level of the fault indication signal of the fault diagnosis path, to obtain the pulled-up target signal. The level of the target signal is higher than the diagnosis threshold.

It may be understood that, after the first analog switch 201, the second analog switch 202, the first pull-up switch 1051, and the second pull-up switch 1052 in the fault diagnosis system are separately turned on, the CPU 1, the CPU 2, the CPU 3, and the CPU 4 are electrically connected to the first analog switch 201 separately, and the CPU 1, the CPU 2, the CPU 3, and the CPU 4 are also electrically connected to the second analog switch 202 separately, to form the fault diagnosis path. The fault diagnosis path further includes the first analog switch 201 and the second analog switch 202 between the first pull-up switch 1051 and the second pull-up switch 1052.

After the first pull-up unit 1031 and the second pull-up unit 1032 pull up the fault indication signal to obtain the target signal, the target signal is transmitted to the first level shift unit 1081. The level shift unit 1081 sends the target signal to the first management board 1011. The first management board 1011 is configured to detect whether the level of the target signal is lower than the diagnosis threshold. When the level of the target signal is lower than the diagnosis threshold, the first management board 1011 determines that at least one CPU in the CPU 1 to the CPU 4 is faulty. After the first management board 1011 determines that the at least one CPU is faulty, the CPLD of the first management board 1011 notifies the BMC, or the another management chip to collect fault information of the central processing unit.

In this embodiment, after any CPU is faulty in the fault diagnosis system, another CPU may sense that the level of the target signal is lower than the diagnosis threshold, and determine that fault occurs. For example, after the CPU 1 is faulty, the CPU 2 to the CPU 4 separately determine that the level of the target signal is lower than the diagnosis threshold, and determine that the fault occurs. The CPU 2 to the CPU 4 terminate a current service and synchronizes a fault state. It can be understood that fault synchronization between the node boards can be implemented by using the central backplane, which does not require participation of the management board. In addition, the circuit is decoupled from the management board, and the circuit and the function of the management board are simplified. Therefore, the fault diagnosis system provided in this embodiment reduces the cabling of the server management board, to reduce the cabling complexity between the node board and the server management board.

Figure 3:
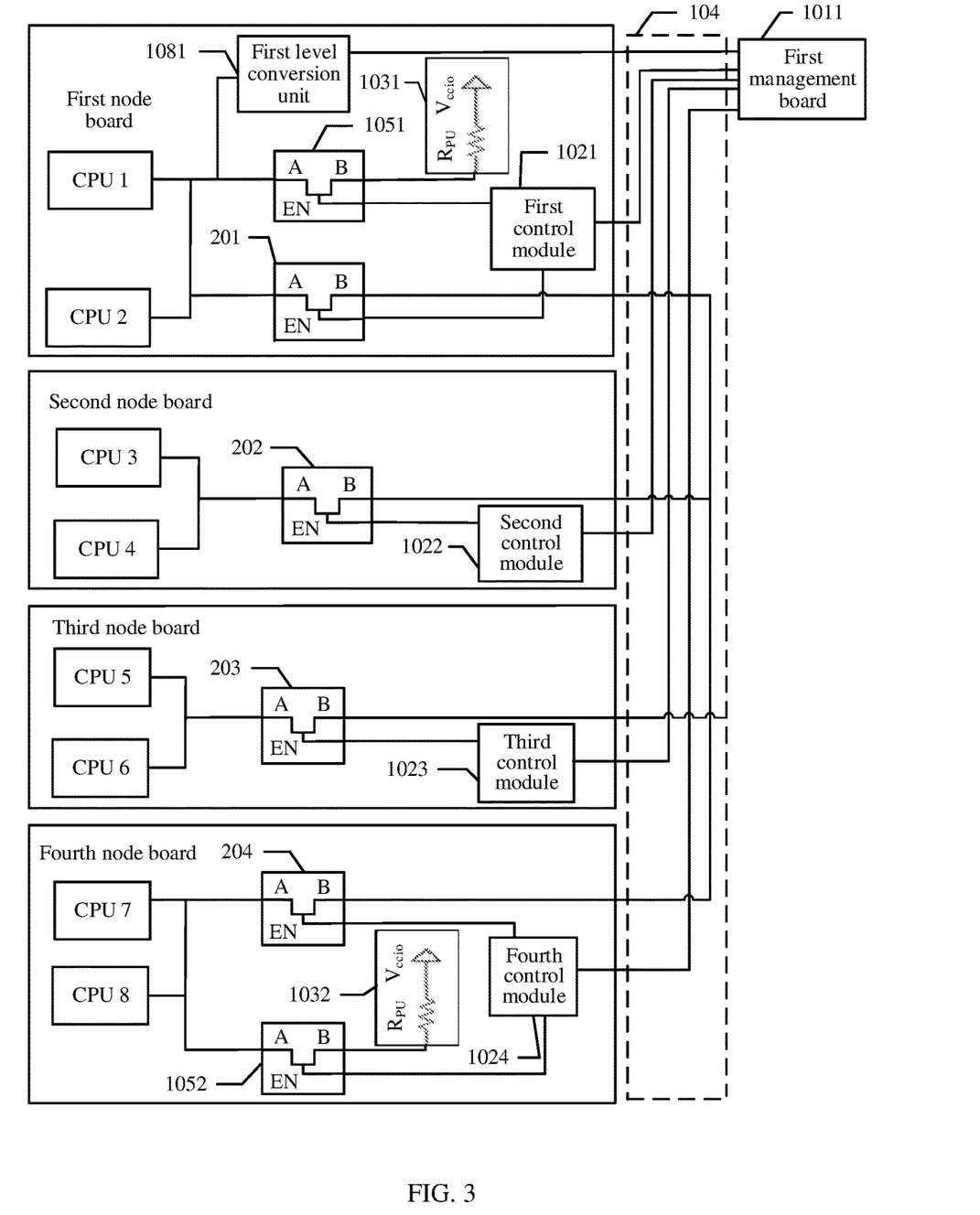
FIG. 3 is another schematic diagram of a fault diagnosis system according to an embodiment of this application.
Figure 4A:
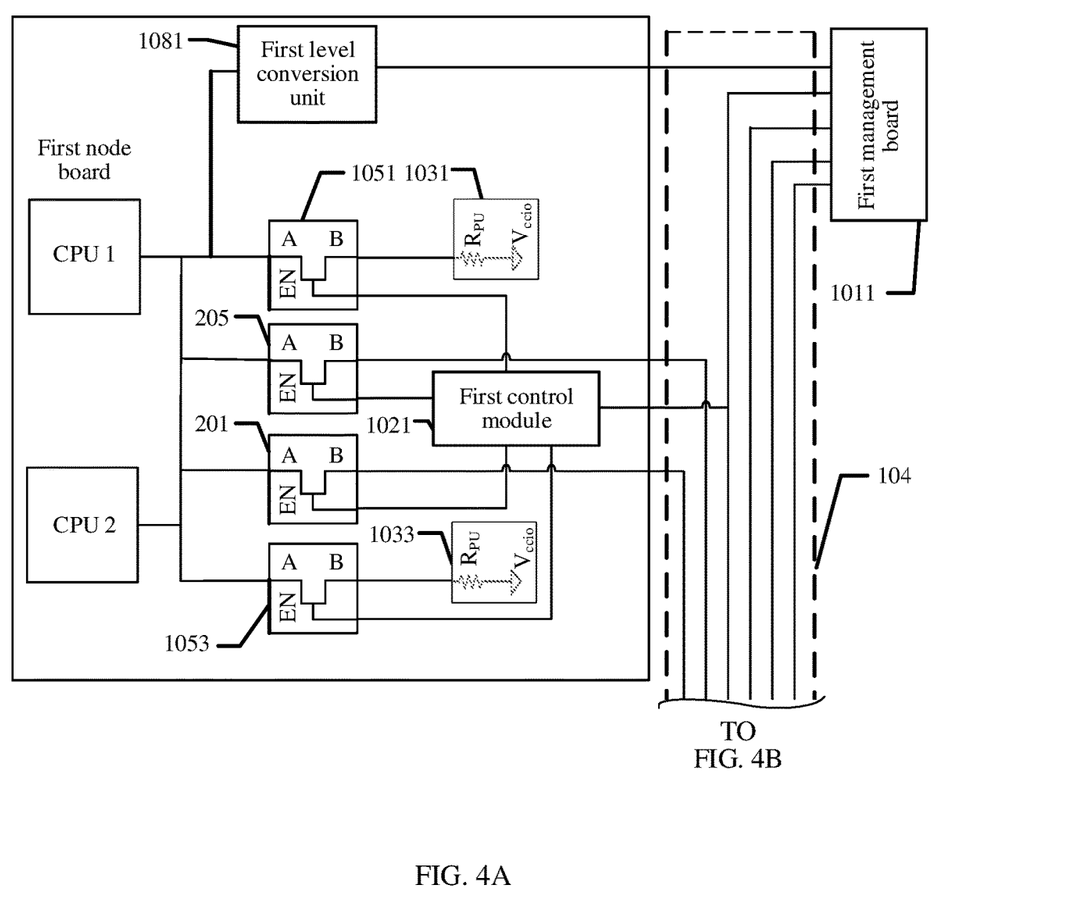
FIG. 4A to FIG. 4D are another schematic diagram of a fault diagnosis system according to an embodiment of this application.
Figure 4B:
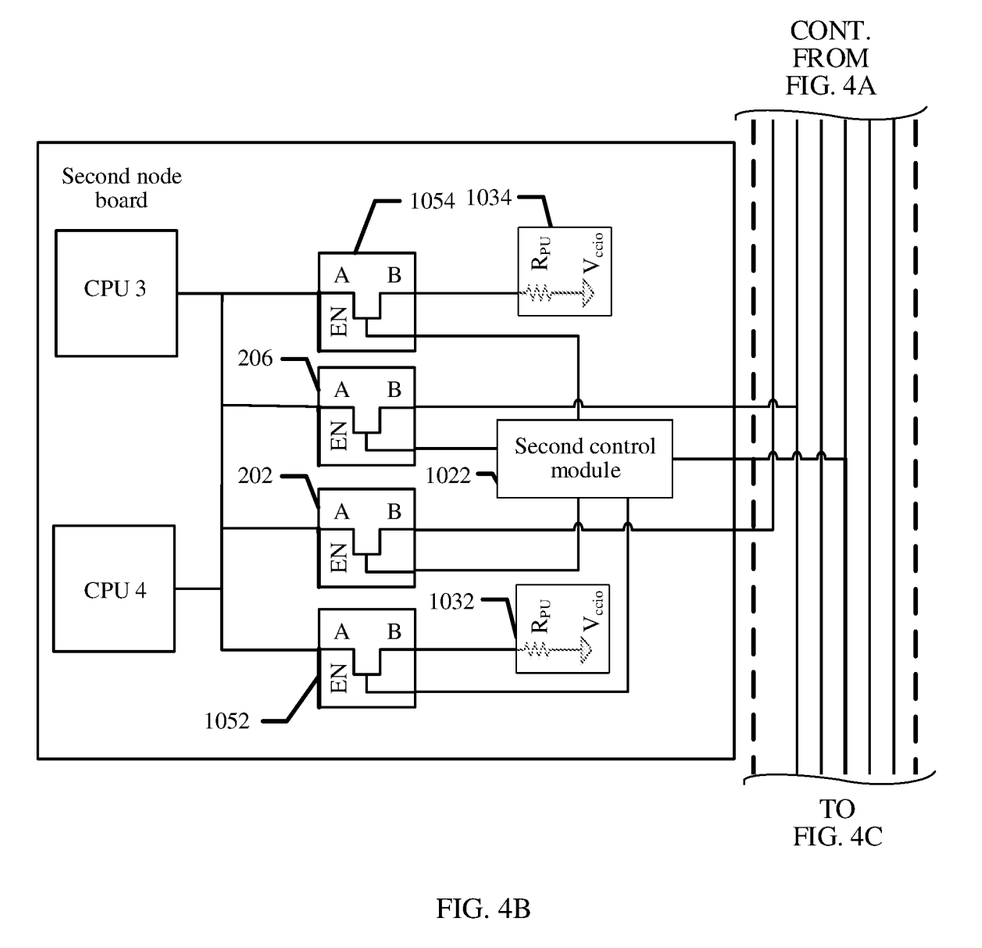
Figure 4C:
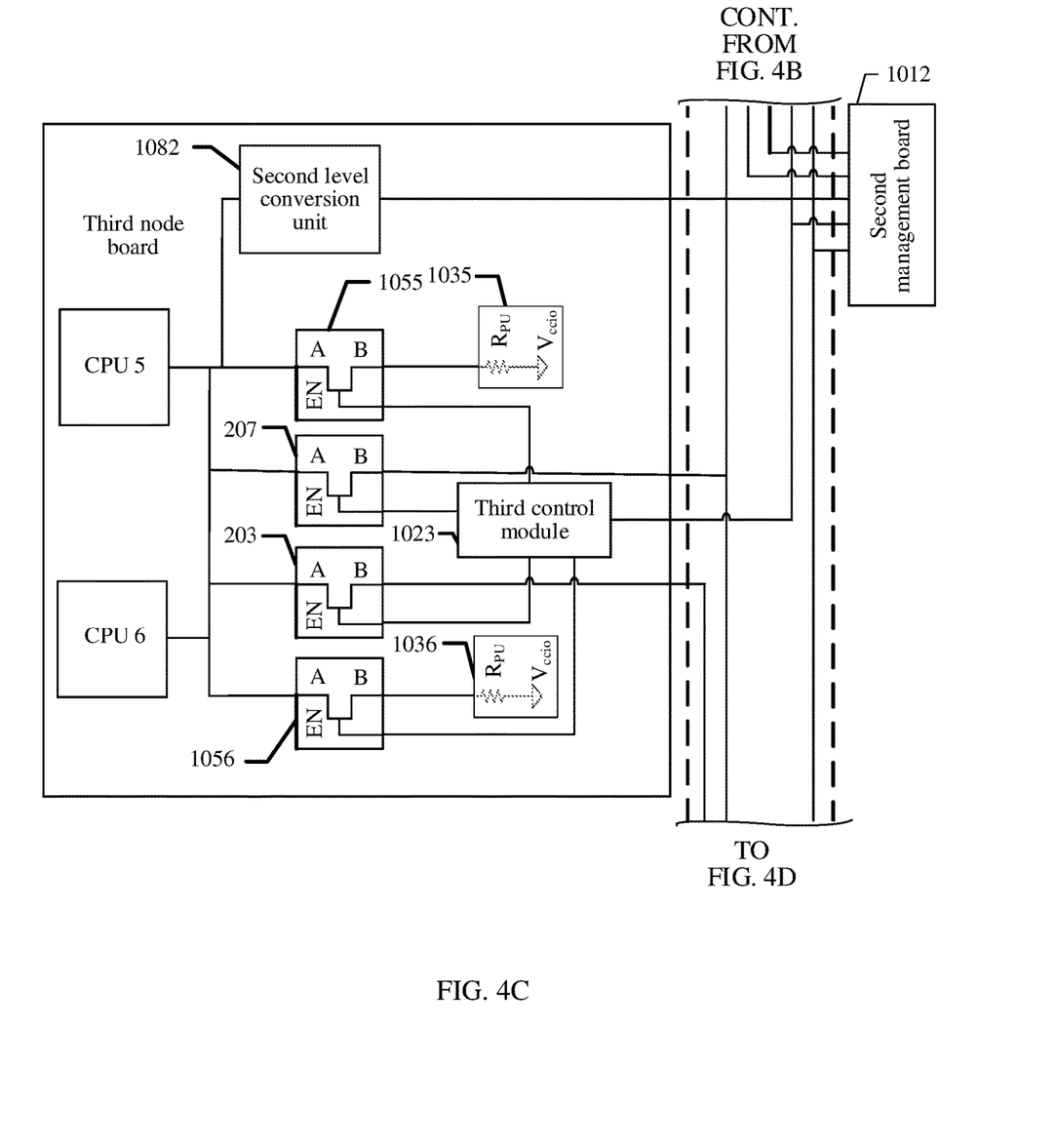
Figure 4D:
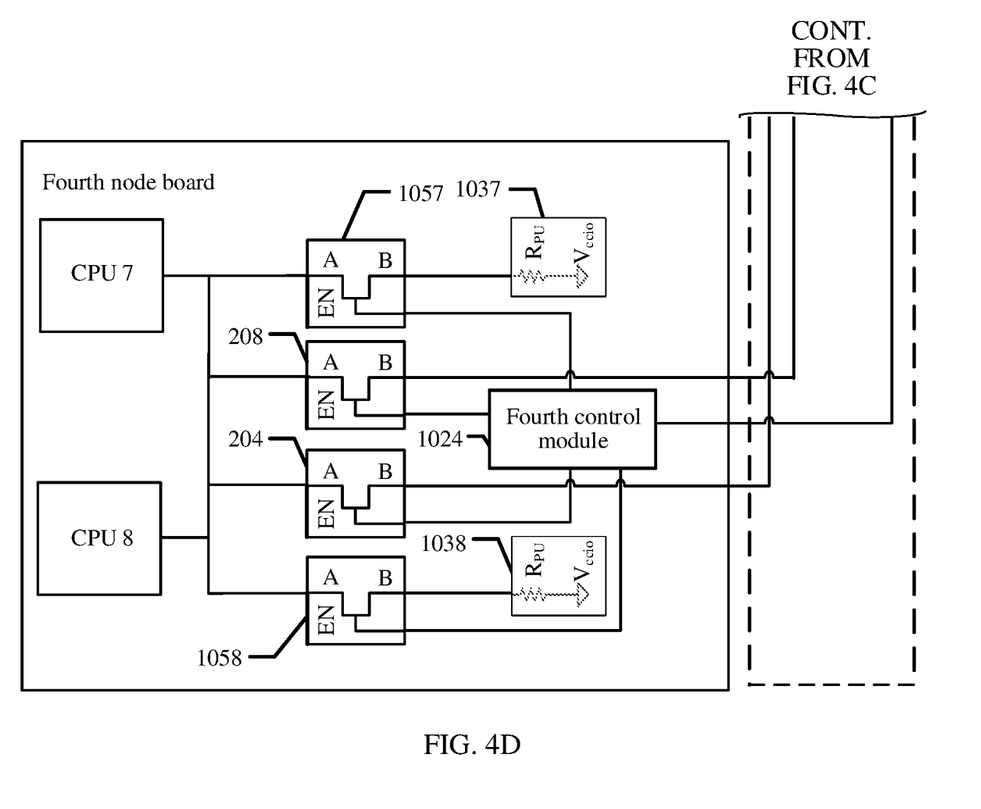

The following describes another fault diagnosis system provided in the embodiments of this application. FIG. 3 is another schematic diagram of a fault diagnosis system according to an embodiment of this application. Another embodiment of the fault diagnosis system provided in the embodiments of this application is described below:

The fault diagnosis system includes the first management board 1011, the first node board, the second node board, a third node board, a fourth node board, and the central backplane 104. The central backplane is separately connected to the first management board 1011, the first node board, the second node board, the third node board, and the fourth node board.

The first node board includes the first control module 1021, the first analog switch 201, the first pull-up unit 1031, the first pull-up switch 1051, the first level shift unit 1081, the CPU 1, and the CPU 2. The first control module 1021 is electrically connected to the first analog switch 201, and the first pull-up switch 1051 separately. The first pull-up unit 1031 is electrically connected to the first pull-up switch 1051. The first analog switch 201 is electrically connected to the first control module 1021. The first level shift unit 1081 is electrically connected to the first management board 1011 by using the central backplane 104. The first control module 1021 is electrically connected to the first management board 1011 by using the central backplane 104.

The second node board includes the second control module 1022, the second analog switch 202, the CPU 3, and the CPU 4. The second control module 1022 is electrically connected to the second analog switch 202. The second control module 1022 is electrically connected to the first management board 1011 by using the central backplane 104.

The third node board includes a third control module 1023, a third analog switch 203, a CPU 5, and a CPU 6. The third control module 1023 is electrically connected to the third analog switch 203. The third control module 1023 is electrically connected to the first management board 1011 by using the central backplane 104.

The fourth node board includes a fourth control module 1024, a fourth analog switch 204, the second pull-up unit 1032, the second pull-up switch 1052, a CPU 7, and a CPU 8. The fourth control module 1024 is electrically connected to the fourth analog switch 204, and the second pull-up switch 1052 separately. The fourth control module 1024 is electrically connected to the first management board 1011 by using the central backplane 104.

In this embodiment, the first control module 1021, the second control module 1022, the third control module 1023, and the third analog switch 203 are electrically connected by using the central backplane 104.

The first control module 1021, the second control module 1022, the third control module 1023, and the fourth control module 1024 are separately configured to receive the physical partitioning information and the presence information sent by the management board. The presence information is the presence information of the another node board and is used to indicate the presence state of the another node board. For example, the first control module 1021 receives presence information respectively corresponding to the second node board, the third node board, and the fourth node board.

The first control module 1021 sends the control signal to the first pull-up switch 1051 based on the physical partitioning information and the slot number information of the first node board. After the first pull-up switch 1051 receives the control signal, the first pull-up switch 1051 is turned on, to enable the first pull-up unit 1031. The first control module 1021 may further send the control signal to the first analog switch 201, so that the first analog switch 201 is turned on.

The second control module 1022 sends the control signal to the second analog switch 202 based on the physical partitioning information and the slot number information of the second node board, so that the second analog switch 202 is turned on.

The third control module 1023 sends the control signal to the third analog switch 203 based on the physical partitioning information and slot number information of the third node board, so that the third analog switch 203 is turned on.

The fourth control module 1024 sends the control signal to the second pull-up switch 1052 based on the physical partitioning information and slot number information of the fourth node board. After the second pull-up switch 1052 receives the control signal, the second pull-up switch 1052 is turned on, to enable the second pull-up unit 1032. The fourth control module 1024 may further send the control signal to the fourth analog switch 204, so that the fourth analog switch 204 is turned on.

After the first analog switch 201, the second analog switch 202, the third analog switch 203, the fourth analog switch 204, the first pull-up switch 1051, and the second pull-up switch 1052 in the fault diagnosis system are turned on separately, the first pull-up unit 1031 and the second pull-up unit 1032 are configured to pull up the level of the fault indication signal of the fault diagnosis path, to obtain the pulled-up target signal. The level of the target signal is higher than the diagnosis threshold.

It may be understood that, after the first analog switch 201, the second analog switch 202, the third analog switch 203, the fourth analog switch 204, the first pull-up switch 1051, and the second pull-up switch 1052 in the fault diagnosis system are turned on separately, the fault diagnosis path is formed. The fault diagnosis path includes the first analog switch 201, the second analog switch 202, the third analog switch 203, and the fourth analog switch 204 between the first pull-up switch 1051 and the second pull-up switch 1052.

After the first pull-up unit 1031 and the second pull-up unit 1032 pull up the fault indication signal to obtain the target signal, the target signal is transmitted to the first level shift unit 1081. The level shift unit 1081 sends the target signal to the first management board 1011. The first management board 1011 is configured to detect whether the level of the target signal is lower than the diagnosis threshold. When the level of the target signal is lower than the diagnosis threshold, the first management board 1011 determines that at least one CPU in the CPU 1 to the CPU 8 is faulty. After the first management board 1011 determines that the at least one CPU is faulty, the CPLD of the first management board 1011 notifies the BMC, or the another management chip to collect the fault information of the central processing unit.

In this embodiment, after any CPU is faulty in the fault diagnosis system, another CPU may determine that the level of the target signal is lower than the diagnosis threshold, and determine that the faulty CPU exists. For example, after the CPU 1 is faulty, the CPU 2 to the CPU 8 determine that the level of the target signal is lower than the diagnosis threshold, and determine that fault occurs. The CPU 2 to the CPU 8 terminate a current service and synchronizes a fault state. It can be understood that fault synchronization between node boards can be implemented by using the central backplane, which does not require participation of the management board. In addition, the circuit is decoupled from the management board, and a circuit and a function of the management board are simplified. Therefore, the fault diagnosis system provided in this application reduces the cabling of the server management board, to reduce the cabling complexity between the node board and the server management board.

It should be noted that, the fourth node board in this embodiment may be the second node board in the embodiment in FIG. 2, and the sequence of the node boards is not limited herein.

The following describes the fault diagnosis system provided in the embodiments of this application by using an 8-socket server. FIG. 4A to FIG. 4D are another schematic diagram of a fault diagnosis system according to an embodiment of this application. Another embodiment of the fault diagnosis system provided in this application is described below:

In the 8-socket server, the fault diagnosis system of the 8-socket server includes the first management board 1011, the second management board 1012, the first node board, the second node board, the third node board, the fourth node board, and a central backplane 104. The central backplane 104 is separately connected to the first management board 1011, the second management board 1012, the first node board, the second node board, the third node board, and the fourth node board.

The first node board includes the first control module 1021, the first analog switch 201, the fifth analog switch 205, the first pull-up unit 1031, the first pull-up switch 1051, a third pull-up unit 1033, a third pull-up switch 1053, the first level shift unit 1081, the CPU 1, and the CPU 2. The first control module 1021 is electrically connected to the first analog switch 201, the fifth analog switch 205, the first pull-up switch 1051, and the third pull-up switch 1053 separately. The first pull-up unit 1031 is electrically connected to the first pull-up switch 1051. The third pull-up unit 1033 is electrically connected to the third pull-up switch 1053. The first level shift unit 1081 is electrically connected to the first management board 1011 by using the central backplane 104. The first control module 1021 is electrically connected to the first management board 1011 and the second management board 1012 by using the central backplane 104.

The second node board includes the second control module 1022, the second analog switch 202, a sixth analog switch 206, the second pull-up unit 1032, the second pull-up switch 1052, a fourth pull-up unit 1034, a fourth pull-up switch 1054, the CPU 3, and the CPU 4. The second control module 1022 is electrically connected to the second analog switch 202, the sixth analog switch 206, the second pull-up switch 1052, and the fourth pull-up switch 1054 separately. The second pull-up unit 1032 is electrically connected to the second pull-up switch 1052. The fourth pull-up unit 1034 is electrically connected to the fourth pull-up switch 1054. The second control module 1022 is electrically connected to the first management board 1011 and the second management board 1012 by using the central backplane 104.

The third node board includes the third control module 1023, the third analog switch 203, a seventh analog switch 207, a fifth pull-up unit 1035, a fifth pull-up switch 1055, a sixth pull-up unit 1036, a sixth pull-up switch 1056, the CPU 5, the CP6, and a second level shift unit 1082. The third control module 1023 is electrically connected to the third analog switch 203, the seventh analog switch 207, the fifth pull-up switch 1055, and the sixth pull-up switch 1056 separately. The fifth pull-up unit 1035 is electrically connected to the fifth pull-up switch 1055. The sixth pull-up unit 1036 is electrically connected to the sixth pull-up switch 1056. The second level shift unit 1082 is electrically connected to the second management board 1011 by using the central backplane 104. The third control module 1023 is electrically connected to the first management board 1011 and the second management board 1012 by using the central backplane 104.

The fourth node board includes the fourth control module 1024, the fourth analog switch 204, an eighth analog switch 208, a seventh pull-up unit 1037, a seventh pull-up switch 1057, an eighth pull-up unit 1038, an eighth pull-up switch 1058, the CPU 7, and the CPU 8. The fourth control module 1024 is electrically connected to the fourth analog switch 204, the eighth analog switch 208, the seventh pull-up switch 1057, and the eighth pull-up switch 1058 separately. The fourth control module 1024 is electrically connected to the first management board 1011 and the second management board 1012 by using the central backplane 104.

In this embodiment, the first analog switch 201 and the second analog switch 202 in the fault diagnosis system are electrically connected by using the central backplane 104. The third analog switch 203 and the fourth analog switch 204 in the fault diagnosis system are electrically connected by using the central backplane 104. The fifth analog switch 205, the sixth analog switch 206, the seventh analog switch 207, and the eighth analog switch 208 are electrically connected by using the central backplane 104.

In this embodiment, the first control module 1021, the second control module 1022, the third control module 1023, and the fourth control module 1024 are separately configured to receive the physical partitioning information and the presence information of the another node board that are sent by the first management board 1011. The presence information is the presence information of the another node board and is used to indicate the presence state of the another node board.

When the physical partitioning information is in a 2P mode, the first control module 1021 sends the control signal to the first pull-up switch 1051 and the third pull-up switch 1053. The first pull-up switch 1051 turns on the first pull-up switch 1051 based on the control signal, to enable the first pull-up unit 1031. The third pull-up switch 1053 turns on the third pull-up switch 1053 based on the control signal, to enable the third pull-up unit 1033.

After the first pull-up unit 1031 and the third pull-up unit 1033 are enabled, the first pull-up unit 1031 and the third pull-up unit 1033 pull up the level of the fault indication signal to obtain the target signal. The level of the target signal is higher than the diagnosis threshold. The target signal is transmitted to the first management board 1011 by using the first level shift unit 1081. The first management board 1011 is configured to detect whether the level of the target signal is lower than the diagnosis threshold. When the level of the target signal is lower than the diagnosis threshold, the first management board 1011 determines that the at least one of the CPU 1 and the CPU 2 is faulty.

It should be noted that the 2P mode in this embodiment indicates that a service currently executed by the server needs to be performed by only two CPUs, and the second control module 1022, the third control module 1023, and the fourth control module 1024 in the fault diagnosis system may not execute the service.

When the physical partitioning information is in a 4P mode, the first control module 1021 sends the control signal to the first pull-up switch 1051 and the first analog switch 201. The first pull-up switch 1051 turns on the first pull-up switch 1051 based on the control signal, to enable the first pull-up unit 1031. The first analog switch 201 turns on the first analog switch 201 based on the control signal. The second control module 1022 sends the control signal to the second pull-up switch 1052 and the second analog switch 202. The second pull-up switch 1052 turns on the second pull-up switch 1052 based on the control signal, to enable the second pull-up unit 1032. The second analog switch 202 turns on the second analog switch 202 based on the control signal.

After the first analog switch 201 and the second analog switch 202 are turned on, and the first pull-up switch 1051 and the second pull-up switch 1052 are turned on, the first pull-up unit 1031 and the second pull-up unit 1032 pull up the level of the fault indication signal to obtain the target signal. The level of the target signal is higher than the diagnosis threshold. The target signal is transmitted to the first management board 1011 by using the first level shift unit 1081. The first management board 1011 is configured to detect whether the level of the target signal is lower than the diagnosis threshold. When the level of the target signal is lower than the diagnosis threshold, the first management board 1011 determines that the at least one of the CPU 1 to the CPU 4 is faulty.

When the physical partitioning information is in an 8P mode, the first control module 1021 sends the control signal to the first pull-up switch 1051 and the fifth analog switch 205. The first pull-up switch 1051 turns on the first pull-up switch 1051 based on the control signal, to enable the first pull-up unit 1031. The fifth analog switch 205 turns on the fifth analog switch 205 based on the control signal. The second control module 1022 sends the control signal to the sixth analog switch 206. The sixth analog switch 206 turns on the sixth analog switch 206 based on the control signal. The third control module 1023 sends the control signal to the seventh analog switch 207. The seventh analog switch 207 turns on the seventh analog switch 207 based on the control signal. The fourth control module 1024 sends the control signal to the eighth pull-up switch 1058 and the eighth analog switch 208. The eighth pull-up switch 1058 turns on the eighth pull-up switch 1058 based on the control signal, to enable the second pull-up unit 1038. The eighth analog switch 208 turns on the eighth analog switch 208 based on the control signal.

After the fifth analog switch 205 to the eighth analog switch 208 are turned on, and the first pull-up switch 1051 and the eighth pull-up switch 1058 are turned on, the first pull-up unit 1031 and the second pull-up unit 1032 pull up the level of the fault indication signal to obtain the target signal. The level of the target signal is higher than the diagnosis threshold. The target signal is transmitted to the first management board 1011 by using the first level shift unit 1081. The first management board 1011 is configured to detect whether the level of the target signal is lower than the diagnosis threshold. When the level of the target signal is lower than the diagnosis threshold, the first management board 1011 determines that the at least one CPU of the CPU 1 to the CPU 8 is faulty.

The fault diagnosis system provided in this embodiment may be switched to servers in different modes based on the physical partitioning information. For example, the server may be switched to the 2P mode, the 4P mode, or the 8P mode based on the physical partitioning information. Therefore, in this embodiment, a control unit may control, based on the current physical partitioning information, the presence information, and slot number information of a node board, a switch to change a fault indication signal topology, to adapt to current physical partitioning setting and a system requirement. A circuit has a strong adaptation capability. Flexibility of the fault diagnosis system is improved.

Optionally, the fault diagnosis system shown in FIG. 4A to FIG. 4D may be further switched to two 4P modes. For example, the first management board 1011 forms a 4P mode with units in the first node board and the second node board. The second management board 1012 forms the other 4P mode with units in the third node board and the fourth node board. Functions and actions performed by the first management board 1011 and the units in the first node board and the second node board are similar to those in the embodiment corresponding to FIG. 2. Functions and actions performed by the second management board 1012 and the units in the third node board and the fourth node board are not described herein again.

Optionally, in this embodiment, the presence information of the another node board, sent by the first management board 1011 may be used to indicate that any one node board, any two node boards, or any three node boards of the first node board to the fourth node board is or are not in a slot or is or are isolated. A control module corresponding to the node board that is not in the slot or is isolated does not perform an action.

For example, when the presence information indicates that the third node board is not in the slot or is isolated, the first management board 1011 sends the physical partitioning information and the slot number information to the first control module 1021, the second control module 1022, the third control module 1023, and the fourth control module 1024. When the physical partitioning information is in the 8P mode, after the first control module 1021, the second control module 1022, the third control module 1023, and the fourth control module 1024 receive the physical partitioning information, the third control module 1023 is determined, based on the slot number information, not to be in the slot or to be isolated. The third control module 1023 does not perform the action. The first control module 1021, the second control module 1022, and the fourth control module 1024 are separately determined to be in position based on the slot number information. The first control module 1021 sends the control signal to the first pull-up switch 1051 and the fifth analog switch 205. The first pull-up switch 1051 turns on the first pull-up switch 1051 based on the control signal, to enable the first pull-up unit 1031. The fifth analog switch 205 turns on the fifth analog switch 205 based on the control signal. The second control module 1022 sends the control signal to the sixth analog switch 206. The sixth analog switch 206 turns on the sixth analog switch 206 based on the control signal. The fourth control module 1024 sends the control signal to the eighth pull-up switch 1058 and the eighth analog switch 208. The eighth pull-up switch 1058 turns on the eighth pull-up switch 1058 based on the control signal, to enable the second pull-up unit 1038. The eighth analog switch 208 turns on the eighth analog switch 208 based on the control signal.

The first pull-up unit 1031 and the second pull-up unit 1032 pull up the level of the fault indication signal to obtain the target signal. The level of the target signal is higher than the diagnosis threshold. The target signal is transmitted to the first management board 1011 by using the first level shift unit 1081. The first management board 1011 is configured to detect whether the level of the target signal is lower than the diagnosis threshold. When the level of the target signal is lower than the diagnosis threshold, the first management board 1011 determines that at least one CPU of the CPU 1 to the CPU 4 and the CPU 7 to the CPU 8 is faulty.

Figure 5A:
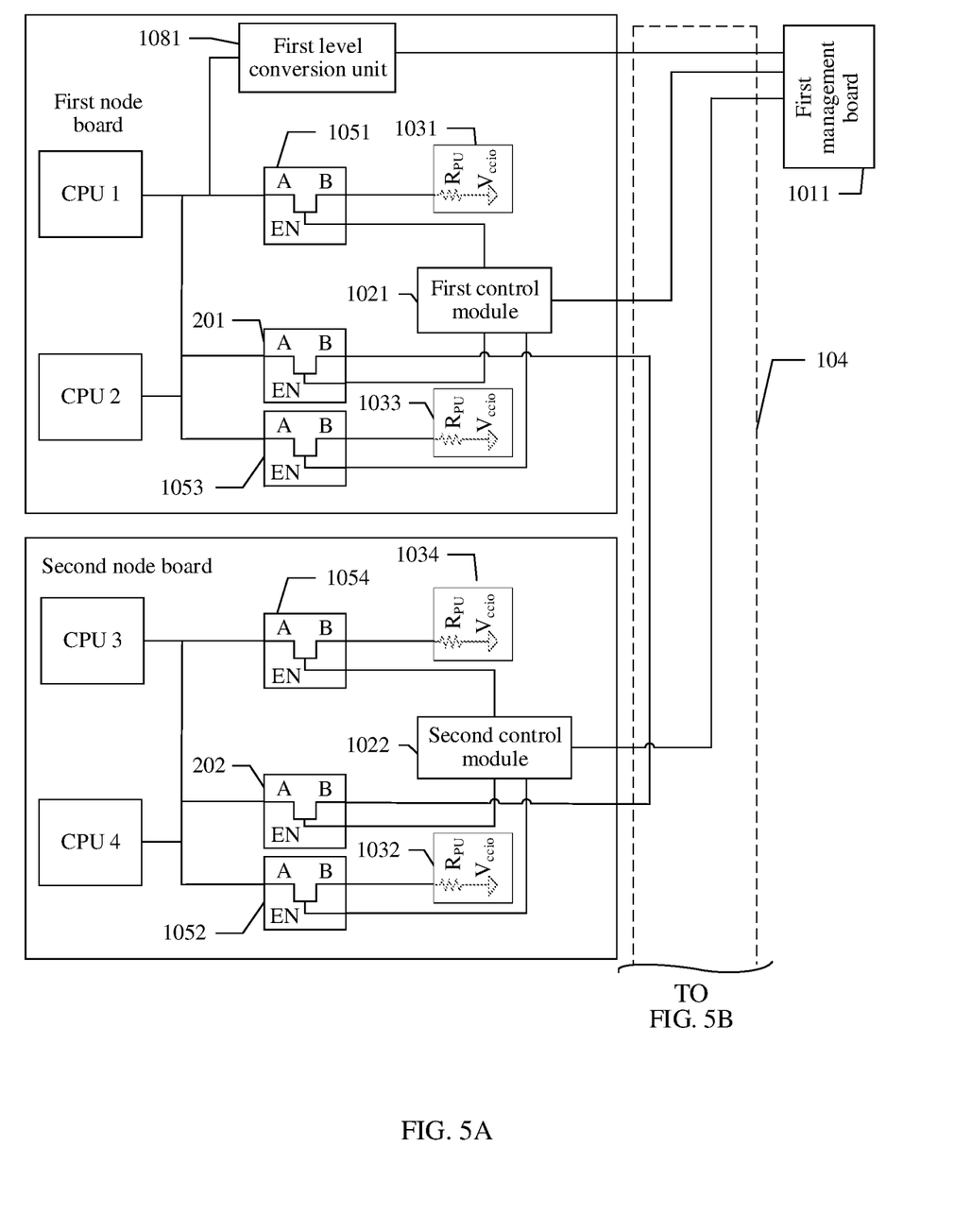
FIG. 5A and FIG. 5B are another schematic diagram of a fault diagnosis system according to an embodiment of this application.
Figure 5B:
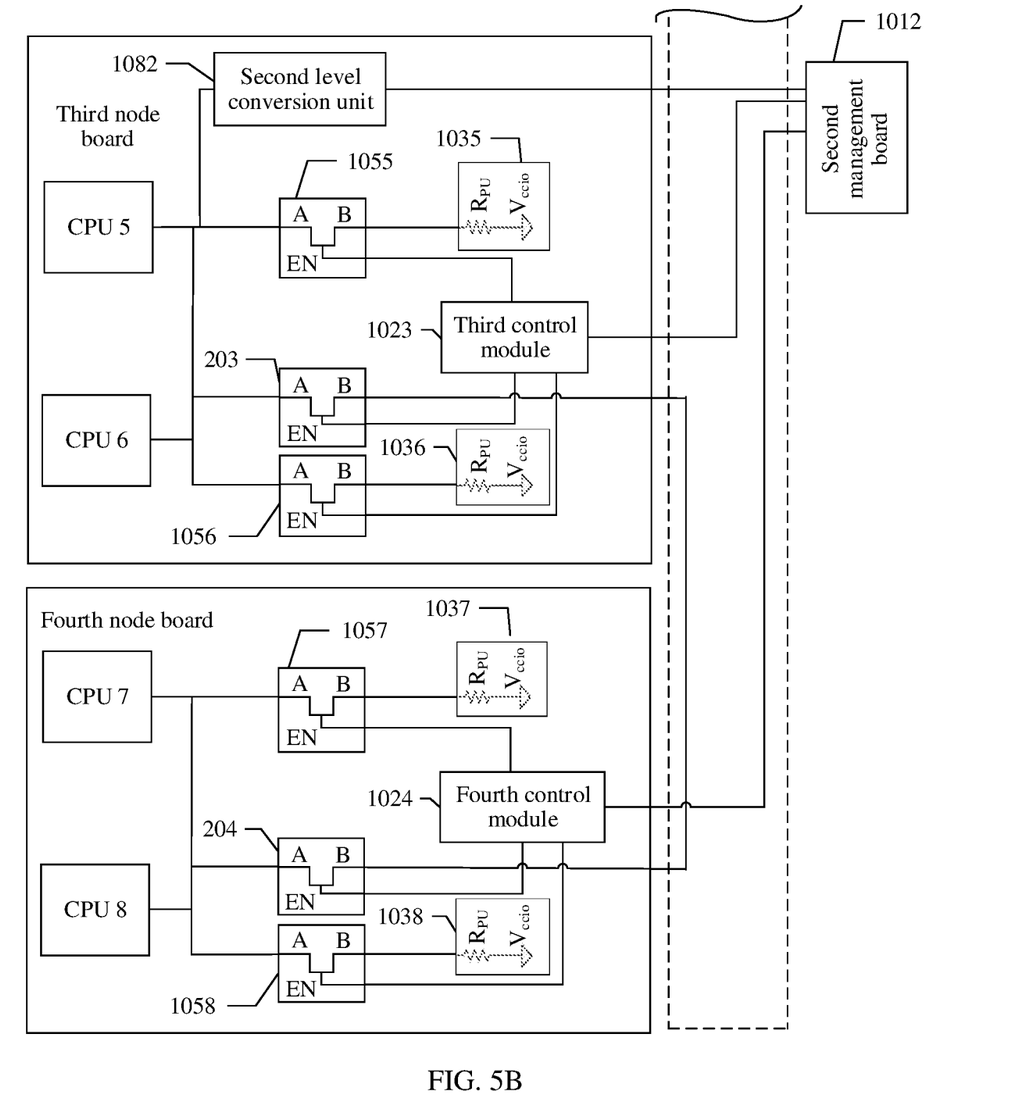

The following describes the fault diagnosis system provided in the embodiments of this application by using two 4-socket servers. FIG. 5A and FIG. 5B are another schematic diagram of a fault diagnosis system according to an embodiment of this application. Another embodiment of the fault diagnosis system provided in this application is described below:

In the two 4-socket servers, the fault diagnosis system of the two 4-socket servers includes the first management board 1011, the second management board 1012, the first node board, the second node board, the third node board, the fourth node board, and the central backplane 104. The central backplane 104 is separately connected to the first management board 1011, the second management board 1012, the first node board, the second node board, the third node board, and the fourth node board. For specific units included in the first node board, the second node board, the third node board, and the fourth node board, refer to FIG. 5A and FIG. 5B.

As shown in FIG. 5A and FIG. 5B, the first management board 1011 is electrically connected to the first control module 1021 and the second control module 1022 separately. The first management board is electrically connected to the first level shift unit 1081 by using the central backplane. The second management board 1012 is electrically connected to the third control module 1023 and the fourth control module 1024 separately. The second management board 1012 is electrically connected to the second level shift unit 1082 by using the central backplane 104.

In this embodiment, the first management board 1011 separately sends the physical partitioning information and the presence information of a node board to the first control module 1021 and the second control module 1022. The second management board 1012 may separately send the physical partitioning information and the presence information of the another node board to the third control module 1023 and the fourth control module 1024. The physical partitioning information is in the 4P mode.

After the first control module 1021 and the second control module 1022 receive the 4P physical partitioning information sent by the first management board 1011, the first management board 1011 forms one 4P mode with units in the first node board and the second node board. Functions and actions performed by the first management board 1011 and the units in the first node board and the second node board are similar to those in the embodiment corresponding to FIG. 2.

After the third control module 1023 and the fourth control module receive the 4P physical partitioning information sent by the second management board 1012, the second management board 1012 forms another 4P mode with the units in the third node board and the fourth node board. Functions and actions performed by the second management board 1012 and the units in the third node board and the fourth node board are similar to those in the embodiment corresponding to FIG. 2.

It should be noted that, in this embodiment, a fault diagnosis system of four 2-socket servers may be further provided. The fault diagnosis system of the four 2-socket servers is similar to the fault diagnosis system of the two 4-socket servers.

An embodiment of this application further provides a server. The server includes the fault diagnosis system corresponding to FIG. 1, the fault diagnosis system corresponding to FIG. 2, the fault diagnosis system corresponding to FIG. 3, the fault diagnosis system corresponding to FIG. 4A to FIG. 4D, or the fault diagnosis system corresponding to FIG. 5A and FIG. 5B. For details, refer to the embodiments corresponding to FIG. 1 to FIG. 5B.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A fault diagnosis system, comprising a control unit, a first management board, a first pull-up unit, a second pull-up unit, a first pull-up switch, a second pull-up switch, and at least one processor, wherein;

the first pull-up unit is electrically connected to the first pull-up switch, the second pull-up unit is electrically connected to the second pull-up switch, the control unit is electrically connected to the first management board, and the control unit is electrically connected to the first pull-up switch and the second pull-up switch separately;

the control unit is configured to receive physical partitioning information sent by the first management board, and control, based on the physical partitioning information, the first pull-up switch and the second pull-up switch to be turned on separately, so that each of the at least one processor is electrically connected to the first pull-up switch and the second pull-up switch separately to form a fault diagnosis path, and the fault diagnosis path comprises a path from the first pull-up unit to the first pull-up switch, from the first pull-up switch to the at least one processor, from the at least one processor to the second pull-up switch, and from the second pull-up switch to the second pull-up unit;

the first pull-up unit and the second pull-up unit are configured to pull up a fault indication signal of the fault diagnosis path to obtain a pulled-up target signal; and the first management board is configured to detect whether a level of the pulled-up target signal is lower than a diagnosis threshold, and upon detection that the level of the pulled-up target signal is lower than the diagnosis threshold, determine that one of the at least one processor on the fault diagnosis path is faulty.

2. The fault diagnosis system according to claim 1, further comprising a first analog switch and a second analog switch, wherein the control unit comprises a first control module and a second control module, the first control module is electrically connected to the first pull-up switch and the first analog switch separately, and the second control module is electrically connected to the second pull-up switch and the second analog switch separately; and the first control module is configured to receive the physical partitioning information sent by the first management board, and control, based on the physical partitioning information, the first pull-up switch and the first analog switch to be separately turned on, the second control module is configured to receive the physical partitioning information sent by the first management board, and control, based on the physical partitioning information, the second pull-up switch and the second analog switch to be separately turned on, so that each of the at least one processor is further electrically connected to the first analog switch and the second analog switch separately to form the fault diagnosis path, and the fault diagnosis path further comprises the first analog switch and the second analog switch between the first pull-up switch and the second pull-up switch.

3. The fault diagnosis system according to claim 2, further comprising a third analog switch and a fourth analog switch wherein
the control unit further comprises a third control module and a fourth control module, the third control module is electrically connected to the third analog switch, and the fourth control module is electrically connected to the fourth analog switch; and
the third control module is configured to receive the physical partitioning information sent by the first management board, and control, based on the physical partitioning information, the third analog switch to be turned on, the fourth control module is configured to receive the physical partitioning information sent by the first management board, and control, based on the physical partitioning information, the fourth analog switch to be turned on, so that each of the at least one processor is further electrically connected to the third analog switch and the fourth analog switch separately to form the fault diagnosis path, and the fault diagnosis path further comprises the third analog switch and the fourth analog switch between the first analog switch and the second analog switch.

4. The fault diagnosis system according to claim 3, further comprising a fifth pull-up unit, a fifth pull-up switch, a sixth pull-up unit, a sixth pull-up switch, a seventh pull-up unit, a seventh pull-up switch, an eighth pull-up unit, and an eighth pull-up switch, wherein the fifth pull-up switch is electrically connected to the first management board, the fifth pull-up unit is electrically connected to the fifth pull-up switch, the sixth pull-up switch is electrically connected to the first management board, the sixth pull-up unit is electrically connected to the sixth pull-up switch, the seventh pull-up switch is electrically connected to the first management board, the seventh pull-up unit is electrically connected to the seventh pull-up switch, the eighth pull-up switch is electrically connected to the first management board, and the eighth pull-up unit is electrically connected to the eighth pull-up switch.

5. The fault diagnosis system according to claim 2, further comprising a third pull-up unit, a third pull-up switch, a fourth pull-up unit, and a fourth pull-up switch, wherein the third pull-up switch is electrically connected to the first management board, the third pull-up unit is electrically connected to the third pull-up switch, the fourth pull-up switch is electrically connected to the first management board, and the fourth pull-up unit is electrically connected to the fourth pull-up switch.

6. The fault diagnosis system according to claim 1, further comprising a central backplane, wherein the central backplane is configured to connect four node boards respectively corresponding to the first control module, the second control module, the third control module, and the fourth control module.

7. The fault diagnosis system according to claim 6, wherein the first management board is further configured to send presence information to the first control module, the second control module, the third control module, and the fourth control module, and the presence information is indicative of presence states of the four node boards respectively corresponding to the first control module, the second control module, the third control module and the fourth control module.

8. The fault diagnosis system according to claim 1, further comprising a level shift unit, wherein the level shift unit is electrically connected to the first management board.

9. The fault diagnosis system according to claim 8, further comprising a second management board, wherein the second management board is electrically connected to the first control module, the second control module, the third control module, and the fourth control module separately.

10. The fault diagnosis system according to claim 9, wherein the physical partitioning information comprises 2P mode information, 4P mode information, or 8P mode information, the 2P mode information corresponds to two processors in the at least one processor, the 4P mode information corresponds to four processors in the at least one processor, and the 8P mode information corresponds to eight processors in the at least one processor.

11. The fault diagnosis system according to claim 1, wherein the first management board comprises a first complex programmable logic device (CPLD).

12. The fault diagnosis system according to claim 11, wherein the control unit comprises a second CPLD.

13. A server, comprising the fault diagnosis system according to claim 1.

14. The fault diagnosis system according to claim 1, wherein the at least one processor includes at least one central processing unit.

* * * * *